United States Patent
Mita

(10) Patent No.: US 11,329,729 B2
(45) Date of Patent: May 10, 2022

(54) OPTICAL RECEIVER CIRCUIT, OPTICAL RECEIVER, OPTICAL TERMINAL DEVICE, AND OPTICAL COMMUNICATION SYSTEM

(71) Applicant: Mitsubishi Electric Corporation, Tokyo (JP)

(72) Inventor: Daisuke Mita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/131,089

(22) Filed: Dec. 22, 2020

(65) Prior Publication Data

US 2021/0111808 A1 Apr. 15, 2021

Related U.S. Application Data

(63) Continuation of application No. PCT/JP2018/026297, filed on Jul. 12, 2018.

(51) Int. Cl.
*H04B 10/60* (2013.01)
*H03H 7/06* (2006.01)

(52) U.S. Cl.
CPC .............. *H04B 10/60* (2013.01); *H03H 7/06* (2013.01)

(58) Field of Classification Search
CPC .......... H04B 10/60; H04B 10/69; H03H 7/06; H05K 1/181; H05K 2201/10121
See application file for complete search history.

(56) References Cited

U.S. PATENT DOCUMENTS

| | | | | |
|---|---|---|---|---|
| 5,287,059 A | * | 2/1994 | Ando | G01N 27/82 324/253 |
| 5,345,167 A | * | 9/1994 | Hasegawa | G05F 1/56 323/902 |
| 5,656,975 A | * | 8/1997 | Imura | H03L 7/10 331/25 |
| 11,079,559 B2 | * | 8/2021 | Leclair | G06F 13/4022 |
| 2001/0045870 A1 | * | 11/2001 | Takai | H03B 1/04 331/177 V |
| 2003/0081297 A1 | * | 5/2003 | Hasegawa | H04B 10/6932 398/202 |

(Continued)

FOREIGN PATENT DOCUMENTS

JP  2000-28872 A  1/2000
JP  2003-134051 A  5/2003

(Continued)

*Primary Examiner* — Tanya T Motsinger
(74) *Attorney, Agent, or Firm* — Birch, Stewart, Kolasch & Birch, LLP

(57) ABSTRACT

An optical receiver circuit includes a light receiving element to convert an optical signal into a current signal, a submount substrate on which the light receiving element is mounted, a wiring connected to an anode pad of the light receiving element and a wire connected to a preamplifier on the submount substrate, a wiring to which a bias voltage is applied on the submount substrate; a wiring connected to a cathode pad of the light receiving element on the submount substrate; and a resistor connected to the wiring to serve as a path when the bias voltage is applied to the light receiving element via the wiring on the submount substrate. A resistance value of the resistor is determined such that a resonance peak between the preamplifier and ground is suppressed and that oscillation in the preamplifier is suppressed.

4 Claims, 8 Drawing Sheets

(56) References Cited

U.S. PATENT DOCUMENTS

| | | | | |
|---|---|---|---|---|
| 2003/0179558 | A1* | 9/2003 | Giaretta | G02B 6/4201 |
| | | | | 361/777 |
| 2008/0192550 | A1* | 8/2008 | Yamada | G11C 7/12 |
| | | | | 365/185.21 |
| 2017/0084662 | A1* | 3/2017 | Daikuhara | H01L 27/14643 |
| 2018/0352327 | A1* | 12/2018 | Onishi | H04R 3/00 |
| 2020/0041729 | A1* | 2/2020 | Moriyama | G02B 6/3814 |
| 2020/0366381 | A1* | 11/2020 | Van Weeren | H04B 10/116 |
| 2021/0111808 | A1* | 4/2021 | Mita | H03H 7/06 |
| 2021/0333813 | A1* | 10/2021 | Lin | G05F 1/575 |
| 2022/0054085 | A1* | 2/2022 | Siddique | A61B 5/6821 |

FOREIGN PATENT DOCUMENTS

| | | |
|---|---|---|
| JP | 2016-18799 A | 2/2016 |
| JP | 2016-25513 A | 2/2016 |

\* cited by examiner

OPTICAL RECEIVER CIRCUIT, OPTICAL RECEIVER, OPTICAL TERMINAL DEVICE, AND OPTICAL COMMUNICATION SYSTEM

CROSS-REFERENCE TO RELATED APPLICATION

This application is a continuation application of International Application PCT/JP2018/026297, filed on Jul. 12, 2018, and designating the U.S., the entire contents of which are incorporated herein by reference.

BACKGROUND OF THE INVENTION

1. Field of the Invention

The disclosure relates to an optical receiver circuit that receives an optical signal, an optical receiver, an optical terminal device, and an optical communication system.

2. Description of the Related Art

In an optical communication system, an optical terminal device that transmits and receives an optical signal includes an optical receiver that converts the optical signal into an electrical signal. The optical receiver includes an optical receiver circuit including a light receiving element that converts an optical signal transmitted through a transmission line such as an optical fiber into a current signal, a preamplifier that converts the current signal into a voltage signal or a so-called electrical signal and amplifies the signal, and a limiting amplifier that amplifies the electrical signal and limits the amplitude thereof to a desired amplitude. The preamplifier typically uses a negative feedback amplifier circuit in which a feedback resistor is inserted between the input and output of an inverting amplifier circuit. An output terminal of the negative feedback amplifier circuit is connected to an input terminal of a single-phase differential conversion circuit. The single-phase differential conversion circuit converts the electrical signal of a single-phase signal into the electrical signal of a differential signal, and outputs the electrical signal to the limiting amplifier in the subsequent stage.

The negative feedback amplifier circuit returns a part of the output signal to the input signal of the opposite phase. Here, a phase difference between the phase of the input signal and the phase of the output signal being fed back of the negative feedback amplifier circuit needs to be smaller than 180° in a frequency range where the open loop gain of the preamplifier is 0 dB or higher. This is because the negative feedback amplifier circuit oscillates when the phase difference is 180° or more and cannot operate in a normal state. The preamplifier is basically designed such that the phase difference is smaller than 180° so as not to oscillate. However, the preamplifier may be affected by the aforementioned phase difference depending on the circuit configuration of the optical receiver circuit connected to the input terminal.

The optical receiver circuit includes the light receiving element, a submount substrate, and a filter circuit. The light receiving element is mounted on the submount substrate. A bias voltage from the outside has noise removed by the filter circuit, and is applied to a cathode pad of the light receiving element via a wire and a wiring on the submount substrate. An anode pad of the light receiving element is connected to the preamplifier by a wire via a wiring on the submount substrate. The optical receiver circuit can be regarded as one RLC resonance circuit when represented by an equivalent circuit and viewed from the side of the input terminal of the preamplifier, and a resonance peak occurs at a specific frequency. In particular, the inductance of the wire and the parasitic inductance of the submount substrate greatly contribute to the occurrence of the peak. The open loop gain characteristic of the preamplifier is also affected by the inductance of the RLC resonance circuit, and its peak value greatly varies depending on the value of the inductance of the RLC resonance circuit. Generally, the phase rotation is increased in the high frequency range, and the preamplifier oscillates when the phase is rotated by 180° or more in the frequency range where the open loop gain is 0 dB or higher.

In the current optical communication system, the transmission capacity is increasing year by year, and the transmission rate required for the optical receiver is also increasing with the increase in the transmission capacity. As the transmission rate increases, the preamplifier needs to suppress the peak in the high frequency range. In response to such a problem, Japanese Patent Application Laid-open No. 2000-28872 discloses a technique in which an electronic circuit element including a preamplifier is used as a submount, and a waveguide optical element is mounted on the electronic circuit element to decrease the wiring length of a wire or the like and reduce the influence of the parasitic inductance.

However, the technique described in Japanese Patent Application Laid-open No. 2000-28872 has manufacturing constraints and has a limit to shortening the wiring. Also, even if the wiring can be shortened, the influence of the inductance component of the wiring on the submount substrate cannot be reduced.

The present disclosure has been made in view of the above, and an object of the present disclosure is to provide an optical receiver circuit capable of suppressing oscillation in a preamplifier in a subsequent stage without manufacturing constraints.

SUMMARY OF THE INVENTION

In order to solve the above problems and achieve the object, an optical receiver circuit of the present invention disclosure includes a light receiving element that converts an optical signal into a current signal, a submount substrate on which the light receiving element is mounted, and a first wiring connected to an anode pad of the light receiving element and a wire connected to a preamplifier on the submount substrate. The optical receiver circuit further includes a second wiring to which a bias voltage is applied on the submount substrate, a third wiring connected to a cathode pad of the light receiving element on the submount substrate, and a first resistive element connected to the third wiring and serving as a path when the bias voltage is applied to the light receiving element via the second wiring on the submount substrate. A resistance value of the first resistive element is determined such that a resonance peak between the preamplifier and ground is suppressed and that oscillation in the preamplifier is suppressed.

DETAILED DESCRIPTION OF THE PREFERRED EMBODIMENTS

An optical receiver circuit, an optical receiver, an optical terminal device, and an optical communication system according to embodiments of the present disclosure will be described below in detail with reference to the drawings.

First Embodiment

Figure 1:
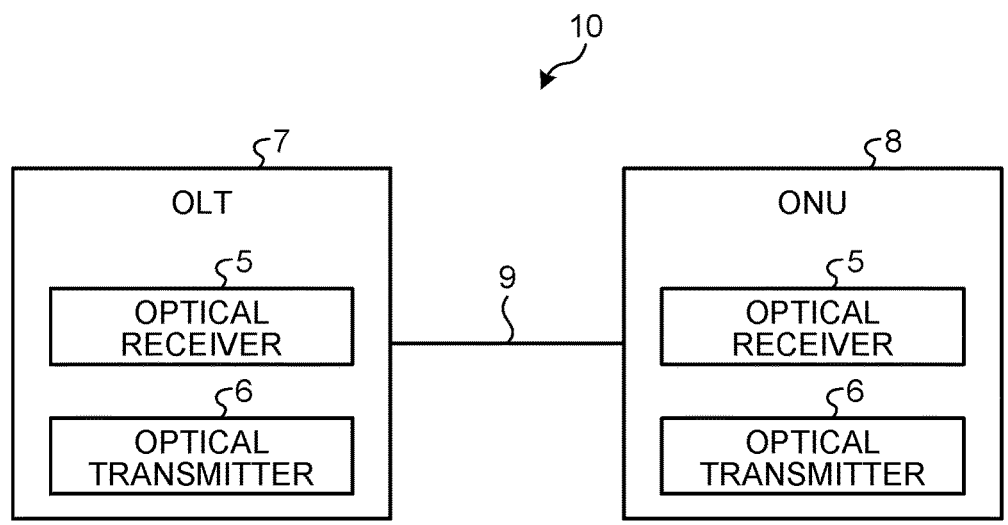
FIG. 1 is a diagram illustrating an example of the configuration of an optical communication system according to a first embodiment.

FIG. 1 is a diagram illustrating an example of the configuration of an optical communication system 10 according to a first embodiment. The optical communication system 10 includes an optical line terminal (OLT) 7 and an optical network unit (ONU) 8. The optical communication system 10 is a system in which the OLT 7 and the ONU 8 communicate with each other by transmitting and receiving an optical signal via a transmission line 9. The OLT 7 is an optical terminal device installed on the side of a station that provides services. The ONU 8 is an optical terminal device installed in a home or the like that receives services. The transmission line 9 is a transmission path through which an optical signal is transmitted and received and is, for example, an optical fiber. Note that the optical communication system 10 illustrated in FIG. 1 illustrates the case where the OLT 7 communicates with one ONU 8 as an example, and thus the OLT 7 can also communicate with a plurality of the ONUs 8. The OLT 7 and the ONU 8 each include an optical receiver 5 and an optical transmitter 6. The optical receiver 5 converts an optical signal received into an electrical signal. The optical transmitter 6 converts an electrical signal into an optical signal and transmits the optical signal. In the present embodiment, the configuration of the optical receiver 5 will be specifically described.

Figure 2:
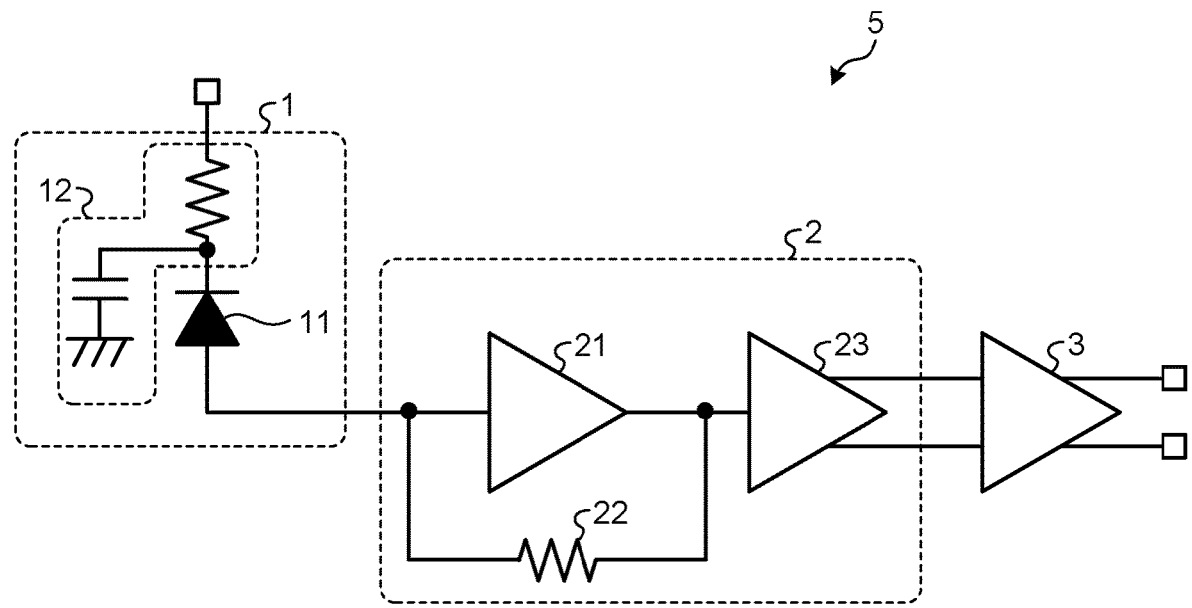
FIG. 2 is a diagram illustrating an example of the configuration of an optical receiver according to the first embodiment.

FIG. 2 is a diagram illustrating an example of the configuration of the optical receiver 5 according to the first embodiment. The optical receiver 5 includes an optical receiver circuit 1, a preamplifier 2, and a limiting amplifier 3. The optical receiver circuit 1 includes a light receiving element 11 and a filter circuit 12. The light receiving element 11 receives an optical signal via the transmission line 9 and converts the optical signal into a current signal. The filter circuit 12 removes noise from a bias voltage that is applied to the light receiving element 11 from an external power source (not illustrated). The filter circuit 12 includes a resistor and a capacitor as illustrated in FIG. 2, for example, but the configuration of the filter circuit 12 is not limited thereto. The preamplifier 2 includes an inverting amplifier circuit 21, a feedback resistor 22, and a single-phase differential conversion circuit 23. The inverting amplifier circuit 21 and the feedback resistor 22 form a negative feedback amplifier circuit. In the preamplifier 2, the negative feedback amplifier circuit converts the current signal obtained by the conversion in the optical receiver circuit 1 into a voltage signal or a so-called electrical signal, and amplifies the electrical signal. The single-phase differential conversion circuit 23 converts the electrical signal from a single-phase signal into a differential signal and outputs the electrical signal. The limiting amplifier 3 amplifies the electrical signal of the differential signal, limits the amplitude thereof to a desired amplitude, and outputs the signal.

Figure 3:
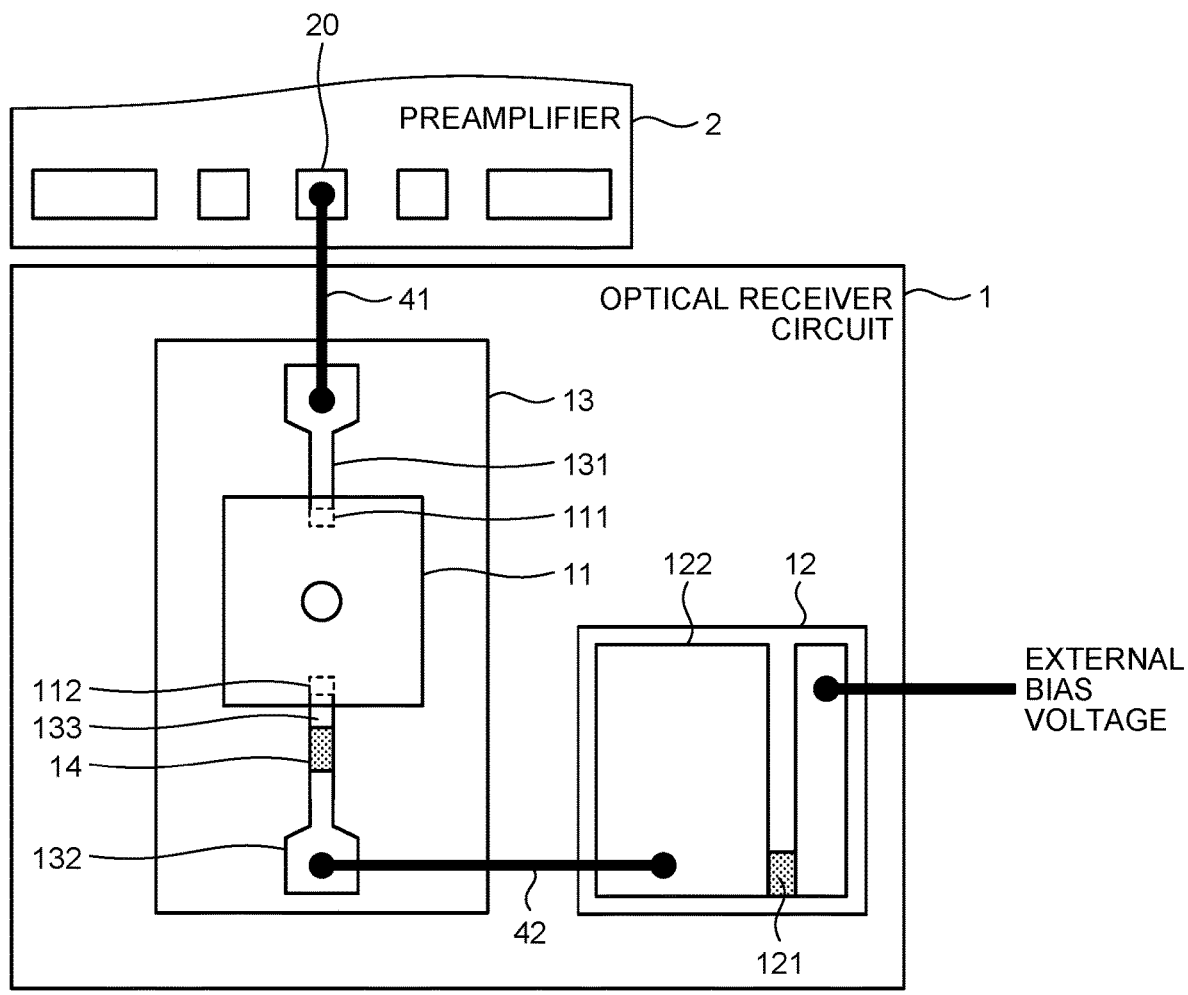
FIG. 3 is a diagram illustrating an example of the circuit configuration of an optical receiver circuit according to the first embodiment.

The configuration of the optical receiver circuit 1 will be described. FIG. 3 is a diagram illustrating an example of the circuit configuration of the optical receiver circuit 1 according to the first embodiment. The optical receiver circuit 1 includes the light receiving element 11, the filter circuit 12, and a submount substrate 13. The filter circuit 12 includes a resistor 121 and a capacitor 122. The light receiving element 11 is mounted on the submount substrate 13. An anode pad 111 of the light receiving element 11 is connected to an input terminal 20 of the preamplifier 2 via a wiring 131 on the submount substrate 13 on which the light receiving element 11 is mounted and a wire 41. The wiring 131 is a first wiring connected to the anode pad 111 of the light receiving element 11 and the wire 41 connected to the input terminal 20 of the preamplifier 2 on the submount substrate 13. The bias voltage applied from the outside passes through the filter circuit 12 to have a noise component removed. Note that in FIG. 3, the bias voltage applied from the outside is expressed as an external bias voltage. The similar applies to the subsequent drawings. The bias voltage is applied to a cathode pad 112 of the light receiving element 11 via the filter circuit 12, a wire 42, a wiring 132 on the submount substrate 13, a resistor 14 formed on the submount substrate 13, and a wiring 133 on the submount substrate 13. The wiring 132 is a second wiring to which the bias voltage is applied on the submount substrate 13. In the first embodiment, the bias voltage is applied to the wiring 132 from the outside via the filter circuit 12. The wiring 133 is a third wiring connected to the cathode pad 112 of the light receiving element 11 on the submount substrate 13. The resistor 14 is a first resistive element that is connected to the wiring 132 and serves as a path when the bias voltage is applied to the light receiving element 11 via the wiring 132 on the submount substrate 13. Note that the circuit configuration illustrated in FIG. 3 is an example and is not limited thereto.

Figure 4:
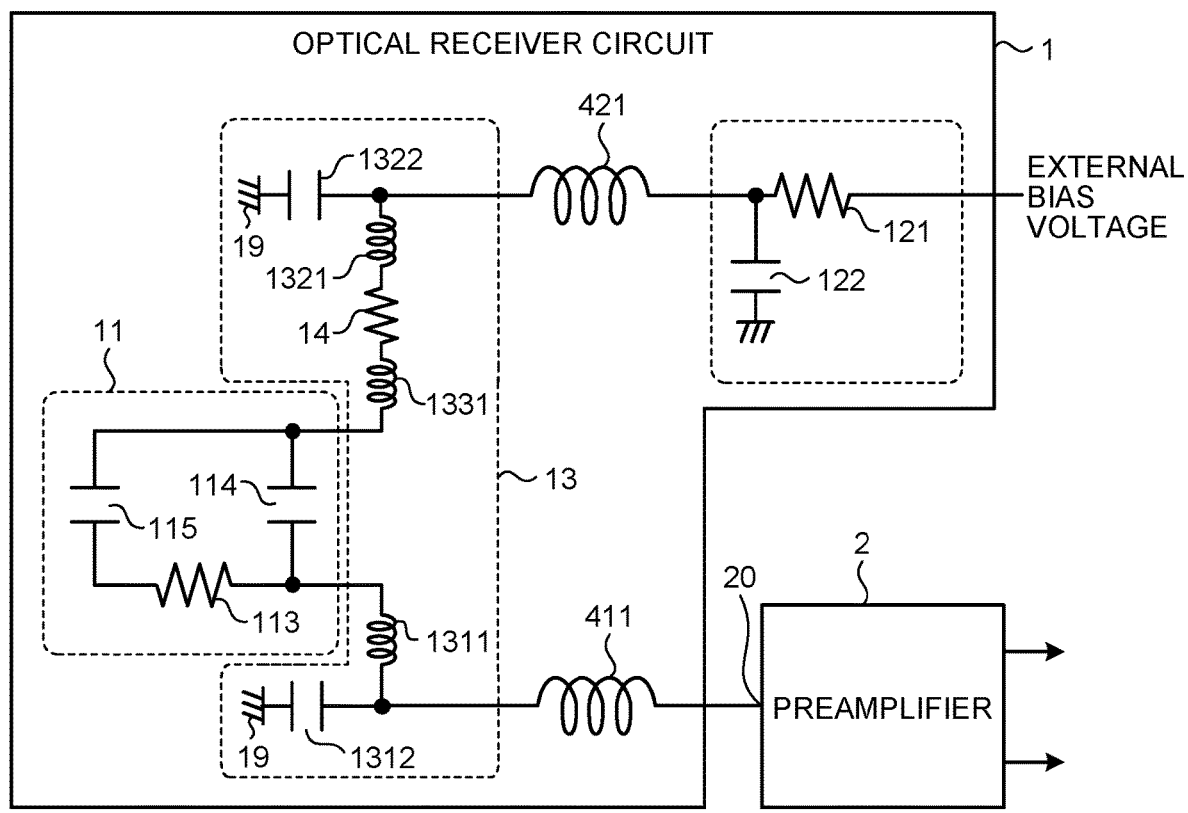
FIG. 4 is a diagram illustrating an example of an equivalent circuit of the circuit configurations of the optical receiver circuit according to the first embodiment illustrated in FIG. 3.

FIG. 4 is a diagram illustrating an example of an equivalent circuit of the circuit configuration of the optical receiver circuit 1 according to the first embodiment illustrated in FIG. 3. The light receiving element 11 is simulated by a junction resistance 113, an electrode pad capacitance 114, and a junction capacitance 115. The submount substrate 13 is simulated by a parasitic inductance 1311 and a parasitic capacitance 1312 caused by the wiring 131, a parasitic inductance 1321 and a parasitic capacitance 1322 caused by the wiring 132, a parasitic inductance 1331 caused by the wiring 133, and the resistor 14. The wire 41 is simulated by an inductance 411. The wire 42 is simulated by an inductance 421. Note that the equivalent circuit illustrated in FIG. 4 is a simplified one and an example, and is not limited thereto.

As illustrated in FIG. 4, when viewed from the side of the input terminal 20 of the preamplifier 2, the optical receiver circuit 1 can be regarded as one RLC resonance circuit formed between the input terminal 20 of the preamplifier 2 and GND 19, and a resonance peak occurs at a specific frequency. The GND 19 is the ground on the submount substrate 13 as illustrated in FIG. 4. In particular, the inductance 411 of the wire 41, the inductance 421 of the wire 42, the parasitic inductance 1311 of the submount substrate 13, and the parasitic inductance 1321 of the submount substrate 13 greatly contribute to the occurrence of the peak at a specific frequency. Here, the resistor 14 between the wiring 131 and the wiring 132 is also a part of the RLC resonance circuit. Generally, the resistor in the RLC resonance circuit can reduce the sharpness of the peak caused by resonance, that is, a Q value. The RLC resonance circuit also has an element resistance represented by the junction resistance 113 of the light receiving element 11, and a resistance value of the element resistance is about several tens of Ω although the value varies depending on the light receiving element 11. The element resistance can be made high in order to reduce the Q value, which however deteriorates the high frequency characteristics. Therefore, in the present embodiment, the optical receiver circuit 1 is provided with the resistor 14 on the submount substrate 13. In the optical receiver circuit 1, the resistance value of the resistor 14 is determined such that the influence of the inductance of the RLC resonance circuit between the preamplifier 2 and the GND 19 is reduced and that the resonance peak of the RLC resonance circuit is suppressed. Specifically, the designer of the optical receiver circuit 1 determines the resistance value of the resistor 14. In the optical receiver 5, when the influence of the inductance of the RLC resonance circuit is reduced and the resonance peak of the RLC resonance circuit of the optical receiver circuit 1 is suppressed, the influence of the inductance of the RLC resonance circuit is also reduced in the preamplifier 2, and the oscillation in the preamplifier 2 is suppressed.

Moreover, in the present embodiment, the optical receiver circuit 1 provided with the resistor 14 on the submount substrate 13 can suppress the resonance peak of the RLC resonance circuit with a small footprint without the need for extra parts. Furthermore, the optical receiver circuit 1 can improve the yield in manufacturing by reducing the number of parts and wiring.

Figure 5:
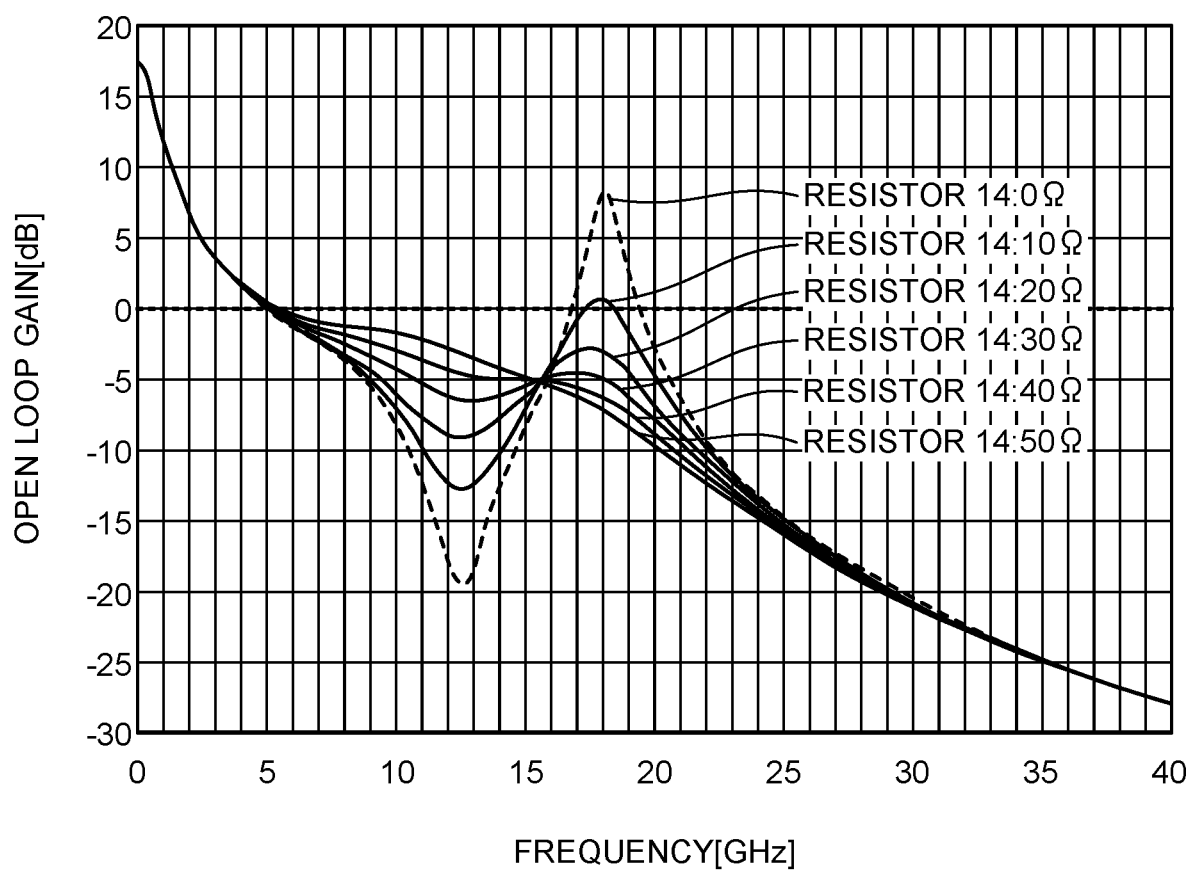
FIG. 5 is a graph illustrating an example of an open loop gain characteristic of a preamplifier of the optical receiver according to the first embodiment.

FIG. 5 is a graph illustrating an example of an open loop gain characteristic of the preamplifier 2 of the optical receiver 5 according to the first embodiment. FIG. 5 illustrates, as an example, the open loop gain characteristic considering the inductance when the inductance 411 and the inductance 421 are set to 500 pH, the parasitic inductance 1311 and the parasitic inductance 1321 are set to 200 pH, and the parasitic capacitance 1312 and the parasitic capacitance 1322 are set to 10 fF in the equivalent circuit of the optical receiver circuit 1 illustrated in FIG. 4. FIG. 5 also illustrates the open loop gain characteristic at each resistance value of the resistor 14 when the resistance value is changed in steps of 10Ω from 0Ω to 50Ω. As illustrated in FIG. 5, the open loop gain characteristic varies greatly depending on the resistance value of the resistor 14, and the larger the resistance value of the resistor 14, the less the influence of the inductance to be able to suppress the oscillation peak of the preamplifier 2. Practically, the peak in the high frequency range at 15 GHz can be suppressed by setting the resistance value of the resistor 14 to about 20Ω as illustrated in FIG. 5, whereby the oscillation of the preamplifier 2 can be avoided.

As described above, in the optical receiver circuit 1 of the present embodiment, the resistor 14 is provided between the wirings 132 and 133 for connecting the cathode pad 112 of the light receiving element 11 and the filter circuit 12 on the submount substrate 13 on which the light receiving element 11 is mounted. In the optical receiver circuit 1, the resistance value of the resistor 14 is determined such that the resonance peak of the RLC resonance circuit between the preamplifier 2 and the GND 19 is suppressed and that the oscillation in the preamplifier 2 is suppressed. As a result, the optical receiver circuit 1 can suppress the oscillation in the preamplifier 2 in the subsequent stage without manufacturing constraints. Moreover, the optical receiver circuit 1 does not have the three-dimensional and complicated structure as described in Japanese Patent Application Laid-open No. 2000-28872, and thus improvement can also be expected in terms of the manufacturing yield as compared with Japanese Patent Application Laid-open No. 2000-28872. Furthermore, the optical receiver circuit 1 does not need to add a decoupling capacitor or the like for suppressing the oscillation of the preamplifier 2, and thus is not subject to the restriction of the footprint.

Second Embodiment

In a second embodiment, a configuration in which the optical receiver circuit 1 does not include the filter circuit 12 will be described.

Figure 6:
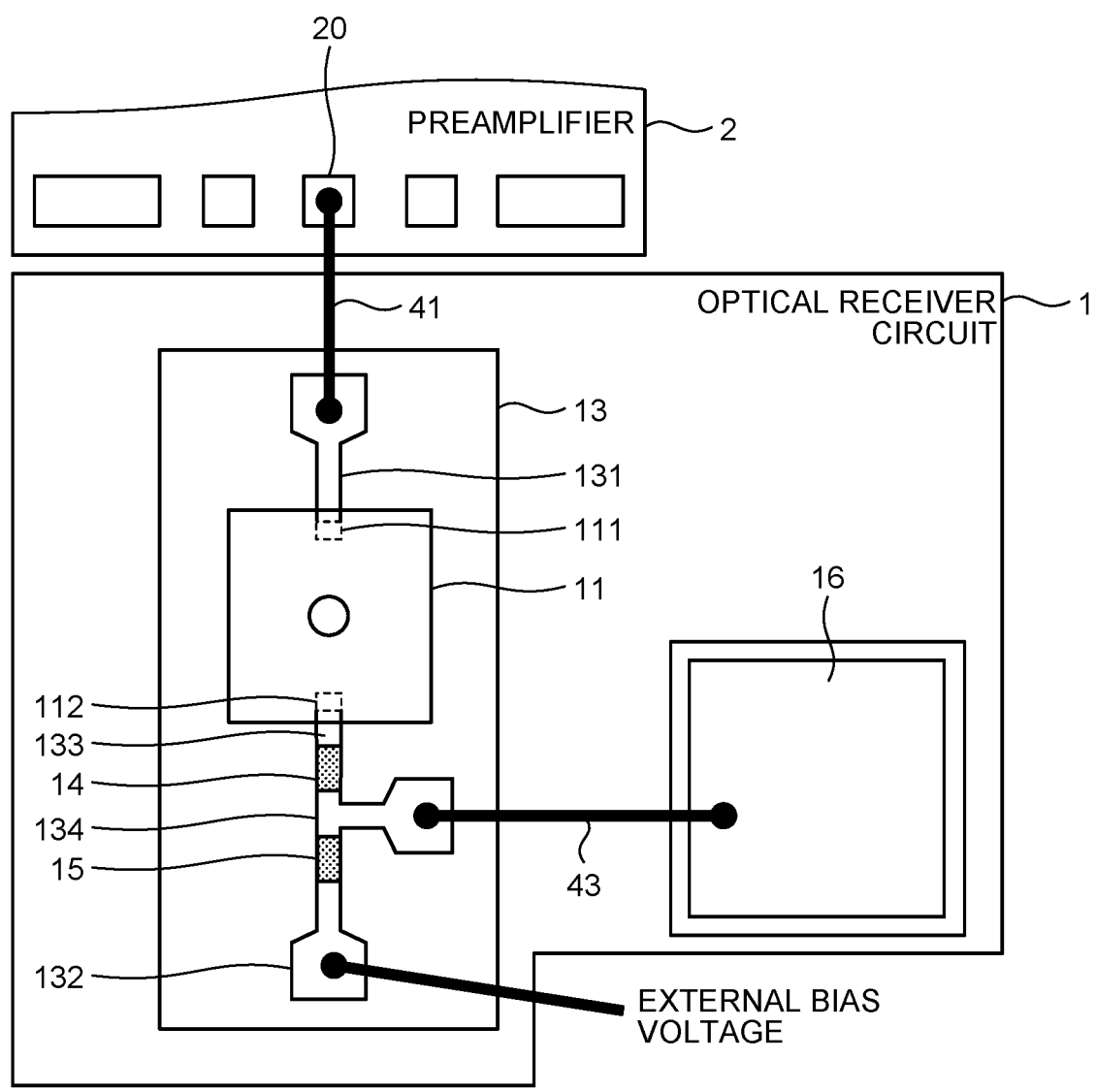
FIG. 6 is a diagram illustrating an example of the circuit configuration of the optical receiver circuit according to a second embodiment.

FIG. 6 is a diagram illustrating an example of the circuit configuration of the optical receiver circuit 1 according to the second embodiment. The optical receiver circuit 1 includes the light receiving element 11, the submount substrate 13, and a capacitor 16. The light receiving element 11 is mounted on the submount substrate 13. The anode pad 111 of the light receiving element 11 is connected to the input terminal 20 of the preamplifier 2 via the wiring 131 on the submount substrate 13 and the wire 41. A wiring 134 on the submount substrate 13 is connected to the capacitor 16 through a wire 43. The wiring 134 is a fourth wiring connected to the resistor 14 and a resistor 15 on the submount substrate 13. The resistor 15 is a second resistive element connected to the wiring 132 on the submount substrate 13. A filter circuit is formed by combining the capacitor 16 connected to the wiring 134 and the resistor 15 formed on the submount substrate 13. A bias voltage from the outside is applied to the wiring 132 on the submount substrate 13. The bias voltage is applied to the cathode pad 112 of the light receiving element 11 via the wiring 132 on the submount substrate 13, the resistor 15 formed on the submount substrate 13, the wiring 134 on the submount substrate 13, the resistor 14 formed on the submount substrate 13, and the wiring 133 on the submount substrate 13. The resistance value of the resistor 15 is set to 100Ω or less. Note that the circuit configuration illustrated in FIG. 6 is an example and is not limited thereto.

Figure 7:
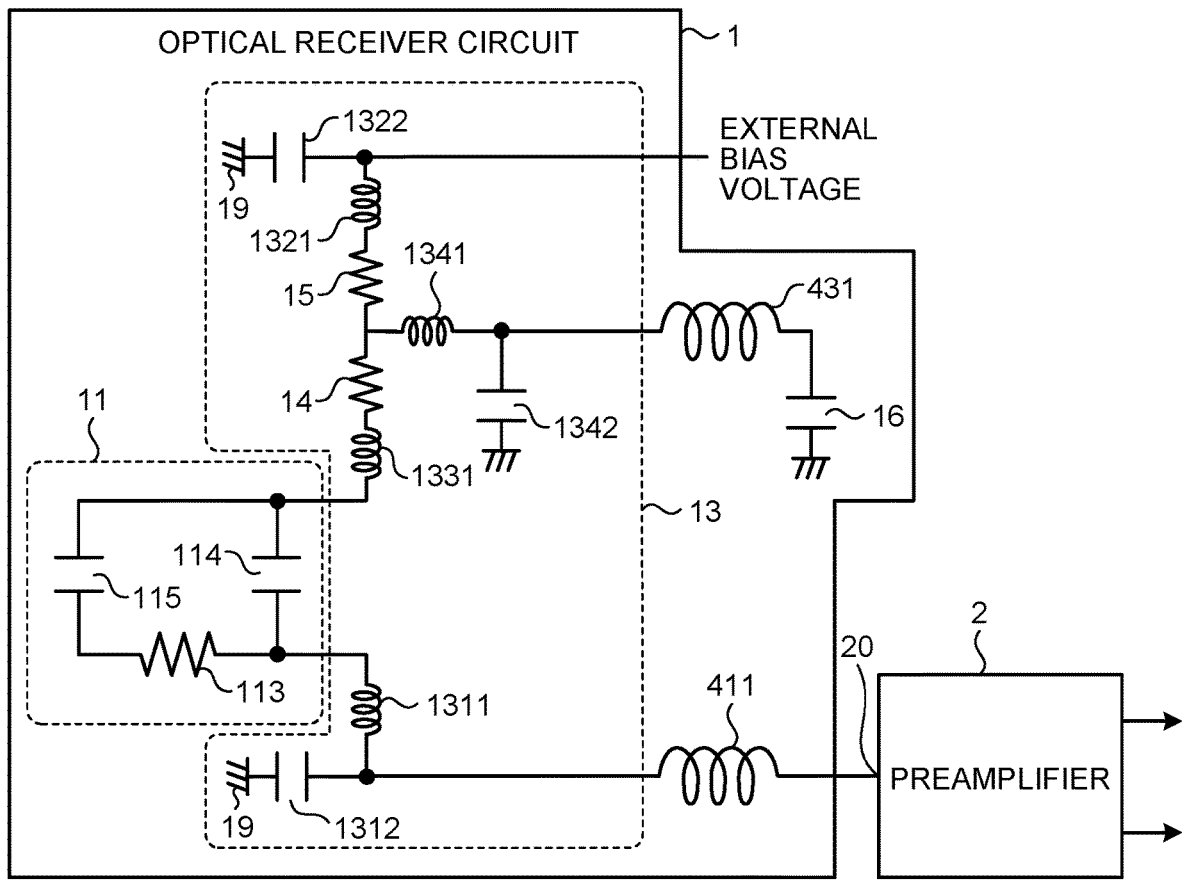
FIG. 7 is a diagram illustrating an example of an equivalent circuit of the circuit configuration of the optical receiver circuit according to the second embodiment illustrated in FIG. 6.

FIG. 7 is a diagram illustrating an example of an equivalent circuit of the circuit configuration of the optical receiver circuit 1 according to the second embodiment illustrated in FIG. 6. The light receiving element 11 is simulated by a junction resistance 113, an electrode pad capacitance 114, and a junction capacitance 115. The submount substrate 13 is simulated by the parasitic inductance 1311 and the parasitic capacitance 1312 caused by the wiring 131, the parasitic inductance 1321 and the parasitic capacitance 1322 caused by the wiring 132, the parasitic inductance 1331 caused by the wiring 133, a parasitic inductance 1341 and a parasitic capacitance 1342 caused by the wiring 134, the resistor 14, and the resistor 15. The wire 41 is simulated by an inductance 411. The wire 43 is simulated by an inductance 431. The capacitor 16 is a capacitor connected to the wiring 134 via the wire 43. Note that the equivalent circuit illustrated in FIG. 7 is a simplified one and an example, and is not limited thereto.

As illustrated in FIG. 7, when viewed from the side of the input terminal 20 of the preamplifier 2, the optical receiver circuit 1 can be regarded as one RLC resonance circuit formed between the input terminal 20 of the preamplifier 2 and the GND 19, and a resonance peak occurs at a specific frequency. As in the first embodiment, the resistor 14 is also a part of the RLC resonance circuit. In the second embodiment as well, in the optical receiver circuit 1, the resistance value of the resistor 14 is determined according to the inductance such that the resonance peak of the RLC resonance circuit is suppressed. The optical receiver 5 suppresses the resonance peak of the RLC resonance circuit of the optical receiver circuit 1, and consequently suppresses the oscillation in the preamplifier 2.

Moreover, in the second embodiment, the optical receiver circuit 1 can form a filter circuit by combining the resistor 15 and the capacitor 16. The optical receiver circuit 1 forms the filter circuit using the capacitor 16 that is inexpensive and small and the resistor 15 on the submount substrate 13 without using the filter circuit 12 that is expensive and has a large footprint. The optical receiver circuit 1 of the second embodiment can obtain the effect similar to that of the first embodiment while reducing the footprint as compared with the optical receiver circuit 1 of the first embodiment.

Third Embodiment

In a third embodiment, a configuration different from that of the second embodiment when the optical receiver circuit 1 does not include the filter circuit 12 will be described.

Figure 8:
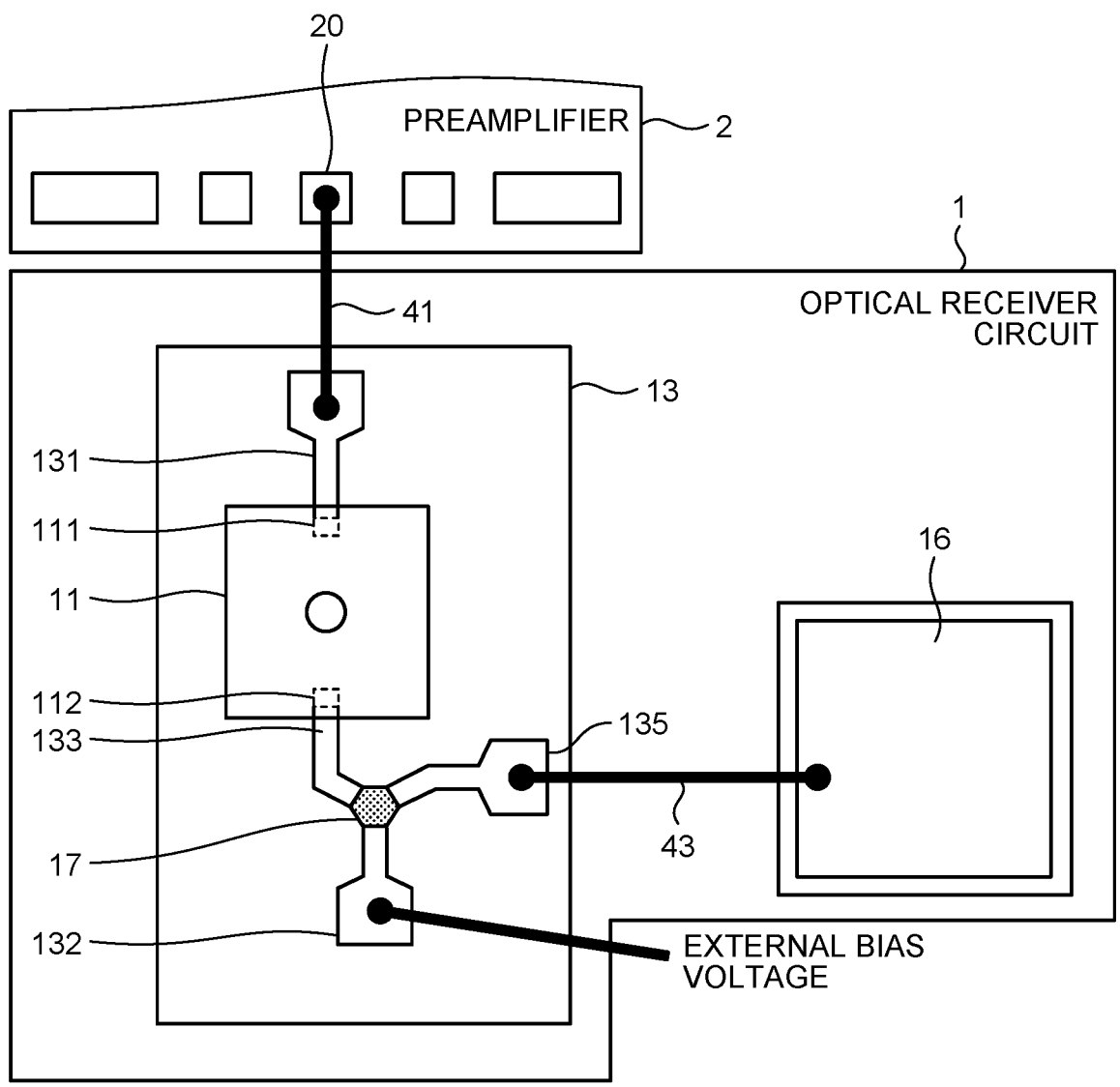
FIG. 8 is a diagram illustrating an example of the circuit configuration of the optical receiver circuit according to a third embodiment.

FIG. 8 is a diagram illustrating an example of the circuit configuration of the optical receiver circuit 1 according to the third embodiment. The optical receiver circuit 1 includes the light receiving element 11, the submount substrate 13, and a capacitor 16. The light receiving element 11 is mounted on the submount substrate 13. The anode pad 111 of the light receiving element 11 is connected to the input terminal 20 of the preamplifier 2 via the wiring 131 on the submount substrate 13 and the wire 41. A wiring 135 on the submount substrate 13 is connected to the capacitor 16 through the wire 43. The wiring 135 is a fifth wiring connected to a three-terminal resistor 17 on the submount substrate 13. A bias voltage from the outside is applied to the wiring 132 on the submount substrate 13. The bias voltage is applied to the cathode pad 112 of the light receiving element 11 via the wiring 132 on the submount substrate 13, the three-terminal resistor 17 formed in the shape of a regular hexagon on the submount substrate 13, and the wiring 133 on the submount substrate 13. The three-terminal resistor 17 is a first resistive element having three terminals. The first terminal of the three-terminal resistor 17 is connected to the wiring 132, and the external bias voltage is applied thereto via the wiring 132. The second terminal of the three-terminal resistor 17 is connected to the wiring 133, and is connected to the cathode pad 112 of the light receiving element 11 via the wiring 133. The third terminal of the three-terminal resistor 17 is connected to the wiring 135, and is connected to the capacitor 16 via the wiring 135 and the wire 43. The shape of the three-terminal resistor 17 is a regular hexagon as an example and is not limited thereto. In the three-terminal resistor 17, the resistance value between the terminals is set to a specified resistance value or less such as 200Ω or less. Note that the circuit configuration illustrated in FIG. 8 is an example and is not limited thereto.

Figure 9:
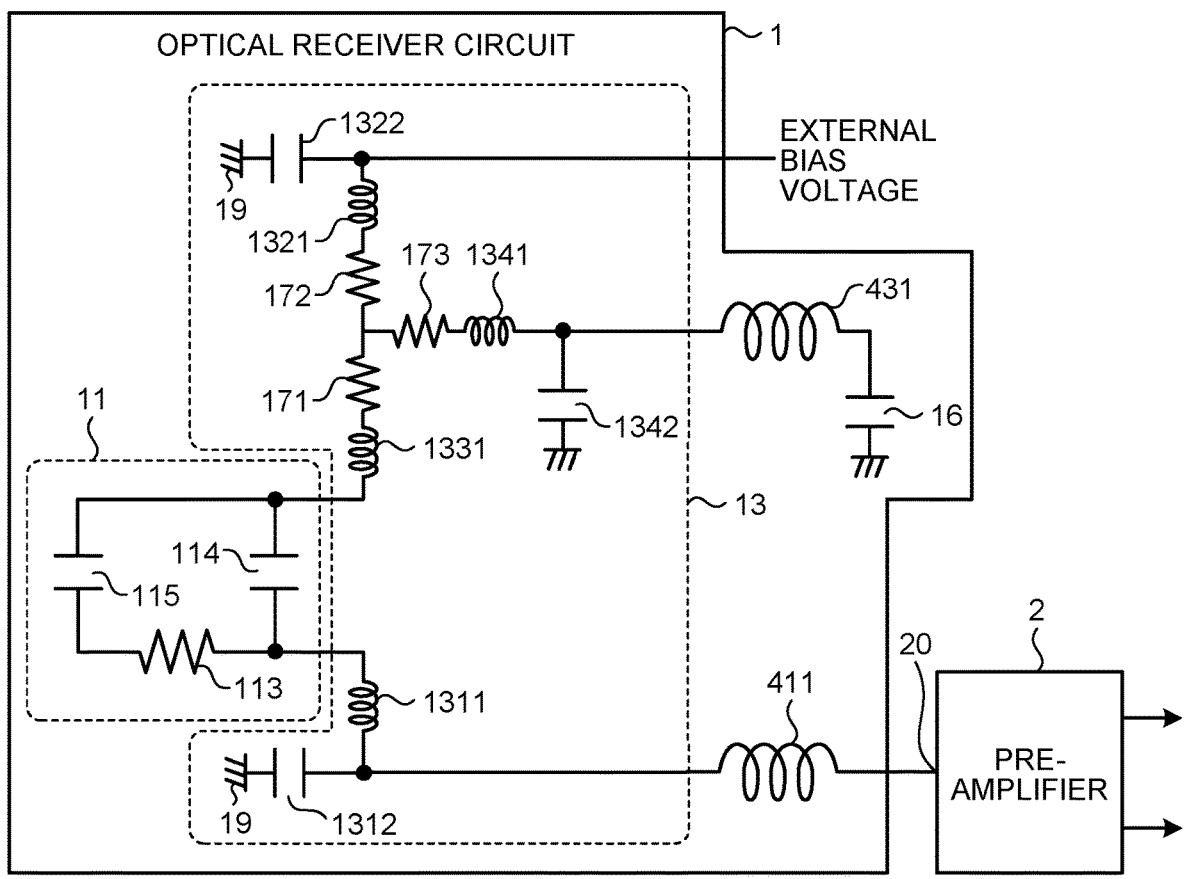
FIG. 9 is a diagram illustrating an example of an equivalent circuit of the circuit configuration of the optical receiver circuit according to the third embodiment illustrated in FIG. 8.

FIG. 9 is a diagram illustrating an example of an equivalent circuit of the circuit configuration of the optical receiver circuit 1 according to the third embodiment illustrated in FIG. 8. The light receiving element 11 is simulated by a junction resistance 113, an electrode pad capacitance 114, and a junction capacitance 115. The submount substrate 13 is simulated by the parasitic inductance 1311 and the parasitic capacitance 1312 caused by the wiring 131, the parasitic inductance 1321 and the parasitic capacitance 1322 caused by the wiring 132, the parasitic inductance 1331 caused by the wiring 133, the parasitic inductance 1341 and the parasitic capacitance 1342 caused by the wiring 134, and resistors 171, 172, and 173 corresponding to the three-terminal resistor 17. The wire 41 is simulated by an inductance 411. The wire 43 is simulated by an inductance 431. The capacitor 16 is the capacitor 16 connected to the wiring 134 via the wire 43. Note that the equivalent circuit illustrated in FIG. 9 is a simplified one and an example, and is not limited thereto.

As illustrated in FIG. 9, when viewed from the side of the input terminal 20 of the preamplifier 2, the optical receiver circuit 1 can be regarded as one RLC resonance circuit formed between the input terminal 20 of the preamplifier 2 and the GND 19, and a resonance peak occurs at a specific frequency. In the third embodiment, when the three-terminal resistor 17 is a regular hexagon, the resistors 171 to 173 all have the same value, and the resistance value between the terminals is twice the resistance value of the resistors 171 to 173. At this time, the resistors 171 and 173 are a part of the RLC resonance circuit as with the resistor 14 of the first and second embodiments. Thus, in the third embodiment, the resistance value of the resistors 171 and 173, that is, the three-terminal resistor 17, is determined according to the inductance such that the resonance peak of the RLC resonance circuit is suppressed. The optical receiver 5 suppresses the resonance peak of the RLC resonance circuit of the optical receiver circuit 1, and consequently suppresses the oscillation in the preamplifier 2.

Moreover, in the third embodiment, the optical receiver circuit 1 can form a filter circuit by combining the capacitor 16 and the resistor 172 connected to the wiring 135. As with the second embodiment, the optical receiver circuit 1 forms the filter circuit using the capacitor 16 that is inexpensive and small and the resistor 172 without using the filter circuit 12 that is expensive and has a large footprint, whereby the effect similar to that of the first embodiment can be achieved while reducing the footprint. In addition, the third embodiment includes one resistive element formed on the submount substrate 13 to be able to improve the yield of the submount substrate 13 as compared to the second embodiment.

The optical receiver circuit according to the present disclosure has an effect that oscillation in the preamplifier in the subsequent stage can be suppressed without manufacturing constraints.

The configuration illustrated in the above embodiment merely illustrates an example, and can thus be combined with another known technique or partially omitted and/or modified without departing from the scope.

What is claimed is:

1. An optical receiver circuit comprising:
   a photoelectric transducer to convert an optical signal into a current signal;
   a submount substrate on which the photoelectric transducer is mounted;
   a first wiring connected to an anode pad of the photoelectric transducer and a wire connected to a preamplifier on the submount substrate;
   a second wiring to which a bias voltage is applied on the submount substrate;
   a filter circuit to remove noise from the bias voltage;
   a third wiring connected to a cathode pad of the photoelectric transducer on the submount substrate; and
   a first resistive element connected to the third wiring to serve as a path when the bias voltage is applied to the photoelectric transducer via the second wiring on the submount substrate, wherein
   a resistance value of the first resistive element is determined such that a resonance peak between the preamplifier and ground is suppressed and that oscillation in the preamplifier is suppressed,
   the bias voltage is applied to the second wiring via the filter circuit,
   the bias voltage is applied to the photoelectric transducer via the filter circuit, the second wiring, the first resistive element, and the third wiring, and
   the filter circuit includes a capacitor and a resistive element connected in series between the bias voltage and the second wiring.

2. An optical receiver comprising the optical receiver circuit according to claim 1.

3. An optical terminal device comprising the optical receiver according to claim 2.

4. An optical communication system comprising the optical terminal device according to claim 3.

* * * * *